United States Patent
Inate (10) Patent No.: US 9,520,859 B2
(45) Date of Patent: Dec. 13, 2016

(54) ELASTIC WAVE DEVICE INCLUDING A CONDUCTIVE SHIELD ELECTRODE AND MANUFACTURING METHOD THEREOF

(71) Applicant: Murata Manufacturing Co., Ltd., Nagaokakyo-shi, Kyoto-fu (JP)

(72) Inventor: Kenji Inate, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 37 days.

(21) Appl. No.: 14/666,430

(22) Filed: Mar. 24, 2015

(65) Prior Publication Data

US 2015/0194948 A1 Jul. 9, 2015

Related U.S. Application Data (63) Continuation of application No. PCT/JP2013/070980, filed on Aug. 2, 2013.

(30) Foreign Application Priority Data

Sep. 25, 2012 (JP) ................................ 2012-210934

(51) Int. Cl.
*H03H 9/72* (2006.01)
*H03H 9/10* (2006.01)
(Continued)

(52) U.S. Cl.
CPC .............. *H03H 9/725* (2013.01); *H01L 41/22* (2013.01); *H03H 3/08* (2013.01); *H03H 9/02913* (2013.01);
(Continued)

(58) Field of Classification Search
CPC ............ H03H 9/02874; H03H 9/02913; H03H 9/0566; H03H 9/0576; H03H 9/058; H03H 9/059; H03H 9/1064; H03H 9/1092; H03H 9/25; H03H 9/64; H03H 9/725; H03H 3/08; H01L 41/22; Y10T 29/42; Y10T 29/49005
(Continued)

(56) References Cited

U.S. PATENT DOCUMENTS 5,864,260 A * 1/1999 Lee ..................... H03H 9/0576
333/133
5,939,956 A * 8/1999 Arimura .............. H03H 9/1014
310/321
(Continued)

FOREIGN PATENT DOCUMENTS

JP 11-074752 A * 3/1999
JP 11-340781 A 12/1999
(Continued)

OTHER PUBLICATIONS

Official Communication issued in International Patent Application No. PCT/JP2013/070980, mailed on Oct. 29, 2013.

*Primary Examiner* — Barbara Summons
(74) *Attorney, Agent, or Firm* — Keating & Bennett, LLP (57) ABSTRACT

In an elastic wave device, a first electrode structure and a second electrode structure are provided on a piezoelectric substrate. The first electrode structure and the second electrode structure define first and second elastic wave element portions, respectively. A support frame on the piezoelectric substrate surrounds the first elastic wave element portion and the second elastic wave element portion. The support frame includes a dividing wall portion that divides the first elastic wave element portion and the second elastic wave element portion. A conductive shield electrode is provided in a groove provided in the dividing wall portion.

19 Claims, 5 Drawing Sheets

(51) Int. Cl.
*H03H 3/08* (2006.01)
*H03H 9/02* (2006.01)
*H01L 41/22* (2013.01)
*H03H 9/25* (2006.01)
*H03H 9/05* (2006.01)

(52) U.S. Cl.
CPC ......... *H03H 9/0576* (2013.01); *H03H 9/1092* (2013.01); *H03H 9/25* (2013.01); *Y10T 29/42* (2015.01)

(58) Field of Classification Search
USPC ........................................ 333/133, 193, 195
See application file for complete search history.

(56) References Cited

U.S. PATENT DOCUMENTS

| | | | |
|---|---|---|---|
| 7,400,216 B2 * | 7/2008 | Fuse | H03H 9/725 333/133 |
| 2004/0212452 A1 * | 10/2004 | Tsutsumi | H03H 9/0038 333/133 |
| 2005/0146397 A1 * | 7/2005 | Koga | H03H 9/0576 333/133 |
| 2009/0091904 A1 | 4/2009 | Hatanaka et al. | |
| 2012/0086309 A1 * | 4/2012 | Yamaji | H03H 9/1092 310/313 B |
| 2012/0223789 A1 | 9/2012 | Inoue et al. | |
| 2013/0205586 A1 | 8/2013 | Takada et al. | |
| 2013/0335171 A1 * | 12/2013 | Yamato | H03H 9/059 333/193 |

FOREIGN PATENT DOCUMENTS

| | | |
|---|---|---|
| JP | 2006-060747 A | 3/2006 |
| JP | 2010-098551 A | 4/2010 |
| JP | 2012-029134 A | 2/2012 |
| JP | 2012-080188 A | 4/2012 |
| JP | 2012-182604 A | 9/2012 |
| WO | 2007/114224 A1 | 10/2007 |
| WO | 2009/104438 A1 | 8/2009 |

* cited by examiner

ELASTIC WAVE DEVICE INCLUDING A CONDUCTIVE SHIELD ELECTRODE AND MANUFACTURING METHOD THEREOF

BACKGROUND OF THE INVENTION

1. Field of the Invention

The present invention relates to an elastic wave device including a plurality of elastic wave elements, such as a duplexer, for example, and a manufacturing method thereof.

2. Description of the Related Art

To date, an elastic wave device has widely been used as a duplexer of a cellular phone. For example, Japanese Unexamined Patent Application Publication No. 2010-98551 discloses a duplexer in which an elastic wave element portion forming a transmission filter and an elastic wave element portion forming a reception filter are provided on the same piezoelectric substrate. In Japanese Unexamined Patent Application Publication No. 2010-98551, a shield electrode is provided between the transmission filter section and the reception filter section.

In the duplexer described in Japanese Unexamined Patent Application Publication No. 2010-98551, the shield electrode is formed between the transmission filter and the reception filter. Thereby, electromagnetic field coupling between the transmission filter and the reception filter is suppressed, which is considered to improve isolation characteristics.

The duplexer described in Japanese Unexamined Patent Application Publication No. 2010-98551, however, is incapable of sufficiently suppressing electromagnetic field coupling and still has insufficient isolation characteristics, despite the above-described shield electrode provided thereto.

SUMMARY OF THE INVENTION

Preferred embodiments of the present invention provide an elastic wave device and a manufacturing method thereof that more effectively reduce or prevent electromagnetic field coupling between elastic wave element portions.

An elastic wave device according to a preferred embodiment of the present invention includes a piezoelectric substrate and first and second electrode structures provided on the piezoelectric substrate. The first and second electrode structures define first and second elastic wave element portions, respectively. Further, in a preferred embodiment of the present invention, a support frame is provided on the piezoelectric substrate. The support frame surrounds a portion provided with the first elastic wave element portion and the second elastic wave element portion.

In a preferred embodiment of the present invention, a cover layer is provided on the support frame. The cover layer defines first and second hollow portions faced by the first and second elastic wave element portions.

The support frame includes a dividing wall portion that divides the first elastic wave element portion and the second elastic wave element portion. A shield electrode made of a conductive material is provided in a groove provided in the dividing wall portion.

In a specific aspect of the elastic wave device according to various preferred embodiments of the present invention, the shield electrode is provided inside a through-groove vertically passing through the dividing wall portion of the support frame. Preferably, the shield electrode extends over the entire length of the dividing wall portion.

In another specific aspect of the elastic wave device according to various preferred embodiments of the present invention, under-bump metal layers each electrically connected to the first electrode structure or the second electrode structure are provided in portions of the support frame to project upward from an upper surface of the support frame, and the under-bump metal layers and the shield electrode are made of the same material.

In another specific aspect of the elastic wave device according to various preferred embodiments of the present invention, at least one third elastic wave element portion is provided on the piezoelectric substrate.

In still another specific aspect of the elastic wave device according to various preferred embodiments of the present invention, the first elastic wave element portion defines and serves as a reception filter section, and the second elastic wave element portion defines and serves as a transmission filter section, to provide a duplexer.

In still yet another specific aspect of the elastic wave device according to various preferred embodiments of the present invention, the shield electrode is connected to a ground potential.

A manufacturing method of an elastic wave device according to yet another preferred embodiment of the present invention is a method of manufacturing the elastic wave device configured in accordance with a preferred embodiment of the present invention. The manufacturing method according to a preferred embodiment of the present invention includes a step of preparing the piezoelectric substrate, a step of forming the first electrode structure and the second electrode structure on the piezoelectric substrate, a step of forming the support frame on the piezoelectric substrate to include the dividing wall portion, a step of providing the cover layer on the support frame to include the first and second hollow portions, and a step of providing the shield electrode in the dividing wall portion of the support frame.

In a specific aspect of the manufacturing method of the elastic wave device according to various preferred embodiments of the present invention, the step of forming the shield electrode includes a step of forming, in the dividing wall portion of the support frame, a concave groove opening in a portion of an upper surface of the dividing wall portion or a through-groove passing through the dividing wall portion, and a step of forming the shield electrode by filling the concave groove or the through-groove with the conductive material.

In another specific aspect of the manufacturing method of the elastic wave device according to various preferred embodiments of the present invention, the step of forming the concave groove or the though-groove in the dividing wall portion is performed by providing the cover layer on the support frame and thereafter forming the concave groove or the though-groove extending from the cover layer to the dividing wall portion.

In still another specific aspect of the manufacturing method of the elastic wave device according to various preferred embodiments of the present invention, the manufacturing method of the elastic wave device further includes a step of, when forming the concave groove or the through-groove extending from the cover layer to the dividing wall portion, forming under-bump metal layer through-holes passing through the cover layer and extending to the support frame, and a step of, in the step of forming the shield electrode by filling the concave groove or the through-groove with the conductive material, forming under-bump metal layers by also filling the under-bump metal layer through-holes with the same conductive material.

In still another specific aspect of the manufacturing method of the elastic wave device according to various preferred embodiments of the present invention, the manufacturing method of the elastic wave device further includes a step of forming on the under-bump metal layers bumps to electrically connect with an external device.

In still another specific aspect of the manufacturing method of the elastic wave device according to various preferred embodiments of the present invention, the first elastic wave element portion defines a reception filter section, and the second elastic wave element portion defines a transmission filter section, to provide a duplexer.

In elastic wave devices according to various preferred embodiments of the present invention, the support frame includes the dividing wall portion, and the shield electrode made of the conductive material is provided in the groove of the dividing wall portion. It is therefore possible to effectively reduce or prevent electromagnetic filed coupling between the first elastic wave element portion and the second elastic wave element portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

With reference to the drawings, specific preferred embodiments of the present invention will be described below to describe the present invention.

Figure 1A:
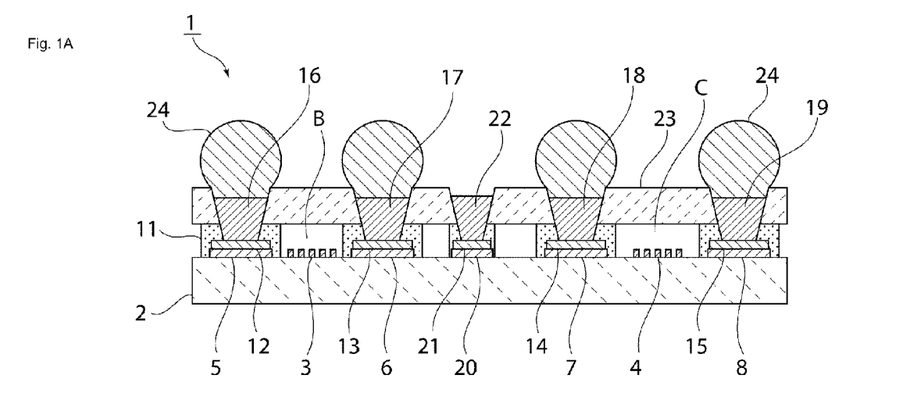
FIG. 1A is an elevation cross-sectional view of an elastic wave device according to a first preferred embodiment of the present invention.
Figure 1B:
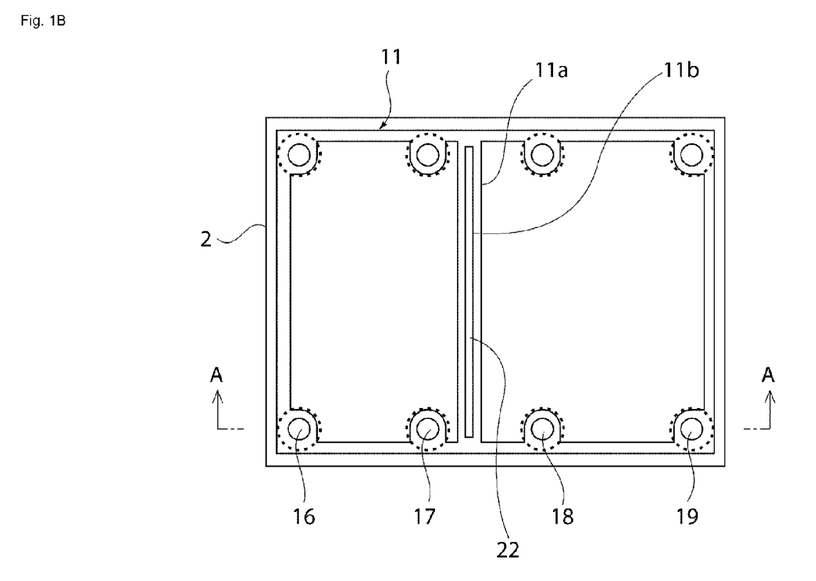
FIG. 1B is a schematic plan view of the elastic wave device, from which a cover layer and bumps are removed.

FIG. 1A is an elevation cross-sectional view of an elastic wave device according to a preferred embodiment of the present invention. Further, FIG. 1B is a plan view of the structure of the elastic wave device 1 according to the present preferred embodiment, from which later-described bumps and cover layer are removed. FIG. 1A is an elevation cross-sectional view of a portion corresponding to a portion taken along a line A-A in FIG. 1B.

The elastic wave device 1 according to the present preferred embodiment is preferably used as a duplexer of a cellular phone, for example.

The elastic wave device 1 includes a piezoelectric substrate 2. The piezoelectric substrate 2 may be defined by a piezoelectric single crystal such as $LiTaO_3$ or $LiNbO_3$, piezoelectric ceramics, or a substrate having a main surface on which a piezoelectric thin film is provided.

A first electrode structure 3 and a second electrode structure 4 are provided on the piezoelectric substrate 2. The first electrode structure 3 includes interdigital transducer electrodes and routing wiring. The first electrode structure 3 is provided to define a transmission filter that is a first elastic wave element portion. The specific configuration of the transmission filter including the first electrode structure 3 should not be particularly limited. For example, an appropriate filter, such as a band pass filter with a ladder circuit configuration, may be configured. Electrode lands 5 and 6 are provided to be electrically connected to the first electrode structure 3.

Meanwhile, the second electrode structure 4 defines a reception filter that is a second elastic wave element portion. The second electrode structure 4 also includes interdigital transducer electrodes and routing wiring. In the present preferred embodiment, the reception filter includes the second electrode structure 4. Therefore, the second electrode structure is provided to define an appropriate filter, such as a band pass filter with a ladder circuit configuration or a band pass filter having a longitudinally coupled resonator-type circuit configuration. Electrode lands 7 and 8 electrically connected to the second electrode structure 4 are provided on the piezoelectric substrate 2.

In the present preferred embodiment, the first electrode structure 3 and the second electrode structure 4 define the above-described first and second elastic wave element portions, respectively. Herein, the first elastic wave element portion and the second elastic wave element portion each include at least one surface acoustic wave element. Thus, a space for allowing vibration of the surface acoustic wave element is required. Therefore, a support frame 11 surrounds a portion provided with the above-described first elastic wave element portion and a portion provided with the above-described second elastic wave element portion.

As illustrated in FIG. 1B, the entire support frame 11 preferably has a rectangular or substantially rectangular frame shape. Further, the support frame 11 includes a dividing wall portion 11a that divides the first electrode structure 3 and the second electrode structure 4, i.e., divides the first elastic wave element portion and the second elastic wave element portion. As illustrated in FIG. 1B, the dividing wall portion 11a is provided between the first electrode structure 3 and the second electrode structure 4. The dividing wall portion 11a extends to connect a pair of mutually facing sides of the rectangular or substantially rectangular or substantially rectangular frame-shaped support frame 11, and to be parallel or substantially parallel to the remaining pair of sides. The dividing wall portion 11a may not extend parallel or substantially parallel to the remaining pair of sides, and may extend to connect the pair of mutually facing sides of the rectangular or substantially rectangular or substantially rectangular frame-shaped support frame 11 with a bent shape or a curved shape thereof. The dividing wall portion 11a may not necessarily be required to be in contact with the rectangular or substantially rectangular frame-shaped support frame 11.

The support frame 11 may be made of insulating ceramics such as $SiO_2$ or $Al_2O_3$ or a synthetic resin, for example.

Metal films 12 to 15 are stacked on the above-described electrode lands 5 to 8. These metal films 12 to 15 are provided to enhance adhesion with later-formed under-bump metal layers 16 to 19. The metal films 12 to 15 may be made of an appropriate metal in accordance with the metal forming the under-bump metal layers 16 to 19. The metal films 12 to 15 are not necessarily required.

A through-groove 11b is provided in the above-described dividing wall portion 11a. As illustrated in FIG. 1A, metal films 20 and 21 are stacked on a portion provided with the dividing wall portion 11a. The metal film 20 is preferably made of the same material as that of the electrode lands 5 to 8. Further, it is desirable that the metal film 21 be made of the same metal as that of the metal films 12 to 15, since it is possible to manufacture the metal films in the same process. The metal film 21, however, may be made of a different metal.

The through-groove 11b is arranged in the above-described dividing wall portion 11a to face the metal film 21. The through-groove 11b preferably extends over the entire length of the dividing wall portion 11a. The through-groove 11b, however, may be partially provided in a plurality in the length direction of the dividing wall portion 11a without extending over the entire length of the dividing wall portion 11a.

The through-groove 11b is provided to extend from the upper surface to the lower surface of the dividing wall portion 11a and expose the metal film 21.

Figure 4:
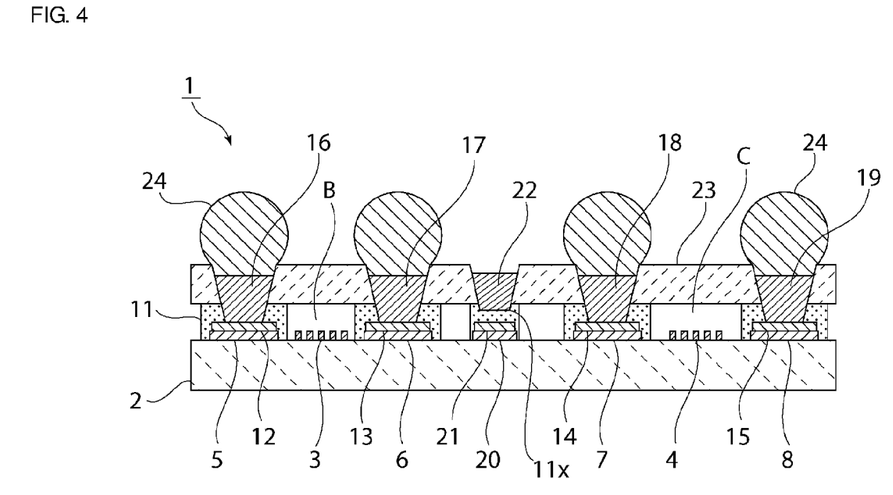
FIG. 4 is an elevation cross-sectional view of an elastic wave device according to a first modified example of the first preferred embodiment of the present invention.

As in a first modified example of the present preferred embodiment illustrated in FIG. 4, however, a concave groove 11x opening in the upper surface may be provided in place of the through-groove 11b. The concave groove 11x preferably does not extend to the lower surface of the dividing wall portion 11a.

Preferably, it is desirable to provide and arrange the through-groove 11b as in the present preferred embodiment. As a result, it is possible to improve a later-described electromagnetic shielding effect. Particularly in the present preferred embodiment, the metal film 21 preferably is provided underneath, and the adhesion between the metal film 21 and a shield electrode 22 is enhanced. It is therefore possible to further improve the electromagnetic shielding effect. Further, it is preferable that the shield electrode 22 be connected to a ground potential, since it is possible to further improve the electromagnetic shielding effect.

The shield electrode 22 preferably made of the same metal as that of the under-bump metal layers 16 to 19 is provided in the above-described through-groove 11b. In the present preferred embodiment, the shield electrode 22 is preferably made of the same metal material as that of the under-bump metal layers 16 to 19. The shield electrode 22, however, may be made of another metal material.

As described above, the support frame 11 has a certain thickness. Therefore, the dividing wall portion 11a also has a certain dimension in the height direction. It is preferable that the dimension in the height direction of the dividing wall portion 11a be greater than the dimension in the height direction of the support frame 11. Further, a cover layer 23 is provided on the support frame 11. The cover layer 23 may be made of insulating ceramics such as alumina or a synthetic resin.

The cover layer 23 is preferably provided with through-holes allowing the under-bump metal layers 16 to 19 and the shield electrode 22 to enter therein. In the present preferred embodiment, the under-bump metal layers 16 to 19 and the shield electrode 22 are preferably formed after these through-holes are formed in the cover layer 23, as will be clear from a later-described manufacturing method.

Since the above-described support frame 11 has a certain thickness, hollow portions B and C are provided when the above-described cover layer 23 is stacked on the upper surface of the support frame 11. That is, the hollow portions B and C for allowing the vibration of the first elastic wave element portion and the second elastic wave element portion are formed.

Bumps 24 are respectively provided on the above-described under-bump metal layers 16 to 19.

It is therefore possible to surface-mount the elastic wave device 1 of the present preferred embodiment in accordance with the flip-chip bonding method, with the bumps 24 facing a mounting surface of a circuit board.

In the elastic wave device 1, the support frame 11 is provided to surround each of the first elastic wave element portion and the second elastic wave element portion, and the above-described shield electrode 22 is provided in the dividing wall portion 11a. It is therefore possible to effectively reduce or prevent electromagnetic field coupling between the first elastic wave element portion and the second elastic wave element portion.

Figure 5A:
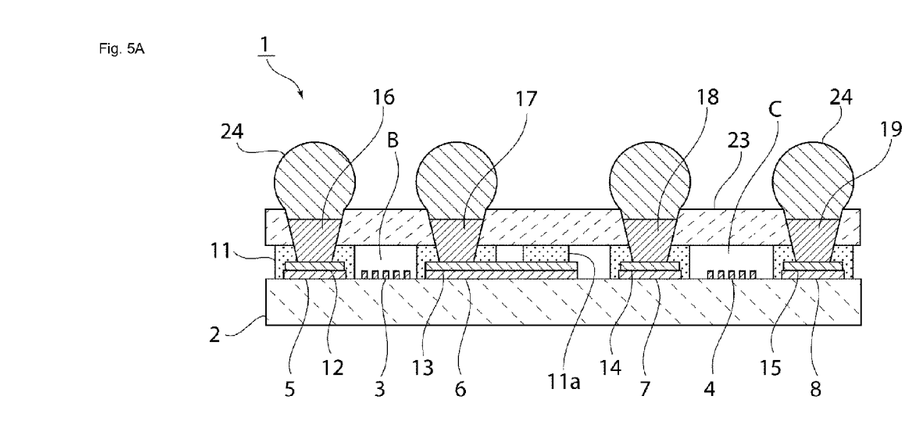
FIG. 5A is an elevation cross-sectional view of an elastic wave device according to a second modified example of the first preferred embodiment of the present invention.
Figure 5B:
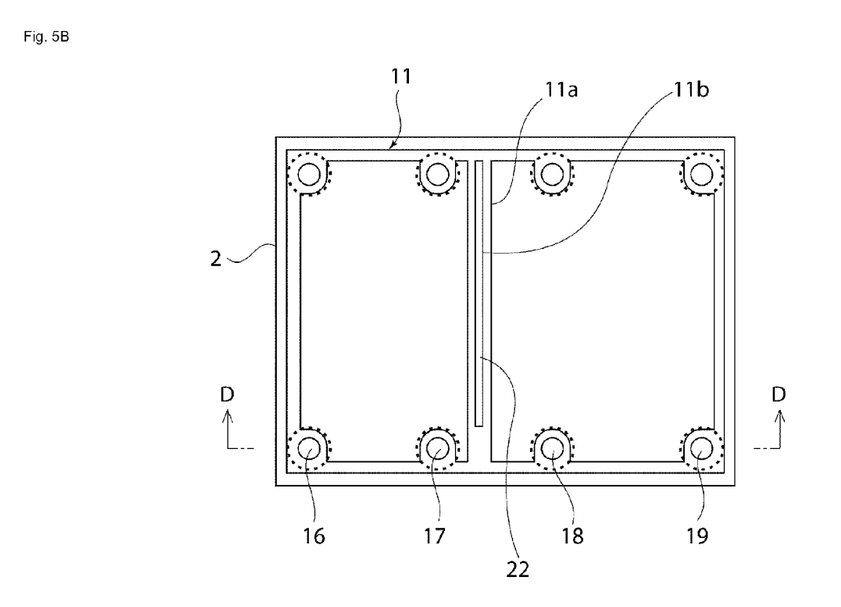
FIG. 5B is a schematic plan view of the elastic wave device, from which a cover layer and bumps are removed.

In the above-described preferred embodiment, the above-described metal film 21 preferably is provided in the dividing wall portion 11a. With the formation of the metal film 21, it is possible to form the shield electrode 22 in the same process as that of the under-bump metal layers 16 to 19. As in a second modified example of the present preferred embodiment illustrated in FIGS. 5A and 5B, however, the above-described metal film 21 is not required to be provided over the entire length in the length direction of the above-described through-groove 11b in the length direction of the dividing wall portion 11a. FIGS. 5A and 5B correspond to FIGS. 1A and 1B in the above-described preferred embodiment. FIG. 5A is a cross-sectional view of an elastic wave device corresponding to a portion taken along a line D-D in FIG. 5B. In the cross-section taken along the line D-D, the through-groove 11b does not exist in the dividing wall portion 11a, as is clear from FIG. 5A. That is, as illustrated in FIG. 5B, the length of the through-groove 11b is preferably set to be shorter than in the first preferred embodiment. Further, in the cross-sectional portion taken along the line D-D in FIG. 5B, the metal film 13 and the electrode land 6 connected to the under-bump metal layer 17 extend beyond the portion provided with the above-described dividing wall portion 11a. In a portion provided with the above-described through-groove 11b, however, the metal film 21 preferably is provided under the shield electrode 22 similarly to the first preferred embodiment.

In the present modified example, the metal film 13 and the electrode land 6 extend through the dividing wall portion 11a from the side provided with the under-bump metal layer 17 to the other side, as described above. This is because one side of the dividing wall portion defines the transmission filter section and the other side of the dividing wall portion defines the reception filter section, and the metal film 13 and the electrode land 6 are preferably used as a wiring pattern connected to an antenna terminal. That is, the metal film 13 and the electrode land 6 define the wiring pattern connected to the antenna terminal, and are shared by the transmission filter section and the reception filter section. Therefore, the metal film 13 and the electrode land 6 thus configured are required to be electrically insulated from the shield electrode 22. Accordingly, the above-described through-groove 11b, i.e., the shield electrode 22 and the metal film 21, is not provided over the entire length in the length direction of the dividing wall portion 11a.

The metal film 21 of the present preferred embodiment example is not required to be provided over the entire length in the length direction of the dividing wall portion 11a, and may be partially provided. Further, above the metal film 13 and the electrode land 6 included in the wiring pattern connected to the antenna terminal, a portion of the groove having the shield electrode 22 provided therein may be a concave groove not extending to the lower surface of the dividing wall portion 11a but opening in the upper surface of the dividing wall portion 11a, as illustrated in FIG. 4. In this case, it is possible to electrically insulate the metal film 13 and the electrode land 6 from the shield electrode 22, and to improve the electromagnetic shielding effect while having a wiring electrode to connect the first electrode structure 3 and the second electrode structure 4. Accordingly, this configuration is preferable.

A non-limiting example of a manufacturing method of the above-described elastic wave device 1 will now be described.

Figure 2A:
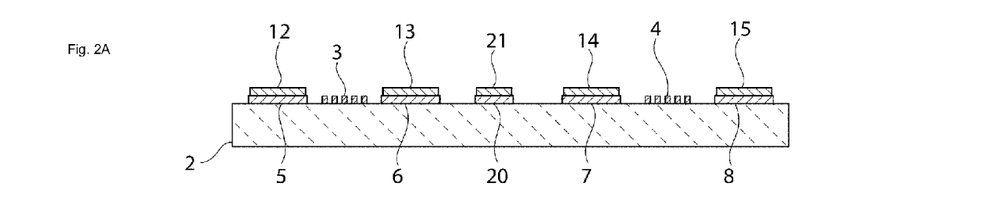
FIGS. 2A-2D are schematic elevation cross-sectional views illustrating a manufacturing method of the elastic wave device according to the first preferred embodiment of the present invention.

As illustrated in FIG. 2A, the first and second electrode structures 3 and 4 and the electrode lands 5 to 8 are first formed on the piezoelectric substrate 2. The method of forming these is not particularly limited, and an appropriate method such as vapor deposition, plating, or sputtering may be used.

Then, the above-described metal films 12 to 15 are formed on the electrode lands 5 to 8. An appropriate method such as vapor deposition, plating, or sputtering may also be used as the method of forming these metal films 12 to 15.

Figure 2B:
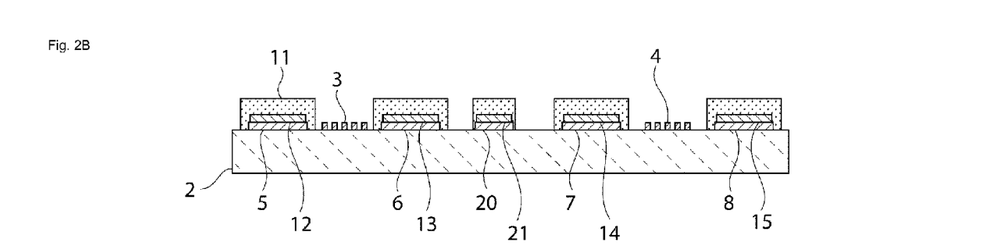

Thereafter, a film made of a material for forming the support frame 11 is formed over the entire surface on the piezoelectric substrate 2, then the film is processed to have a predetermined shape. As a result, the support frame 11 illustrated in FIG. 2B is formed. To obtain the predetermined shape, an appropriate method such as the photolithography method may be used. For example, in the photolithography method, a photoresist may be formed to leave the planar support frame 11 illustrated in FIG. 1B and thereafter subjected to etching.

Figure 2C:
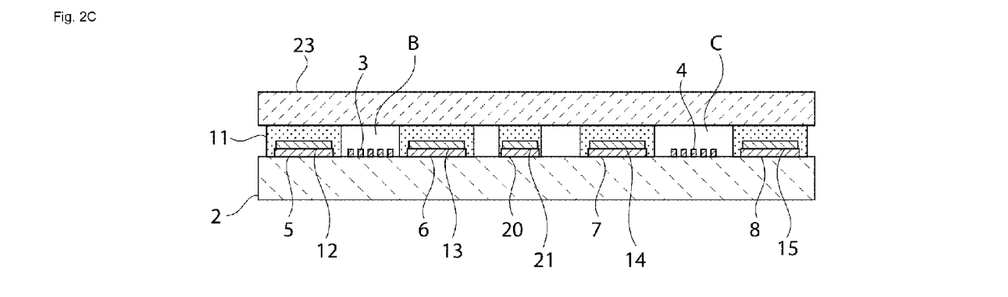

Then, as illustrated in FIG. 2C, the cover layer 23 is stacked on the support frame 11. The stacking of the cover layer 23 may be performed by an appropriate method such as stacking of a synthetic resin film, stacking of an insulating ceramic sheet, or the like.

Figure 2D:
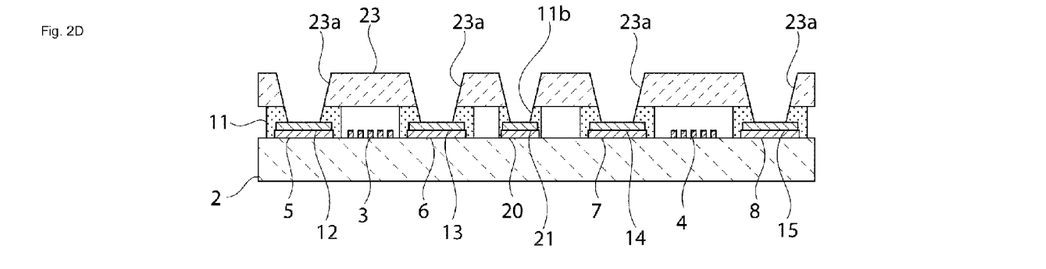

As illustrated in FIG. 2D, a plurality of through-holes 23a are formed by a processing method with a laser or the like directed in a direction of planarly viewing the above-described cover layer 23. The plurality of through-holes 23a are provided to expose the metal films 12 to 15 and the metal film located underneath. Further, one of the above-described through-holes 23a provided on the metal film 21 is provided to have a planar shape of the through-groove 11b.

That is, the through-holes 23a provided in the cover layer 23 pass therethrough at the same positions as those of the through-holes 23a in the support frame 11 located underneath. As a result, the metal films 12 to 15 and the metal film 21 are exposed.

Figure 3:
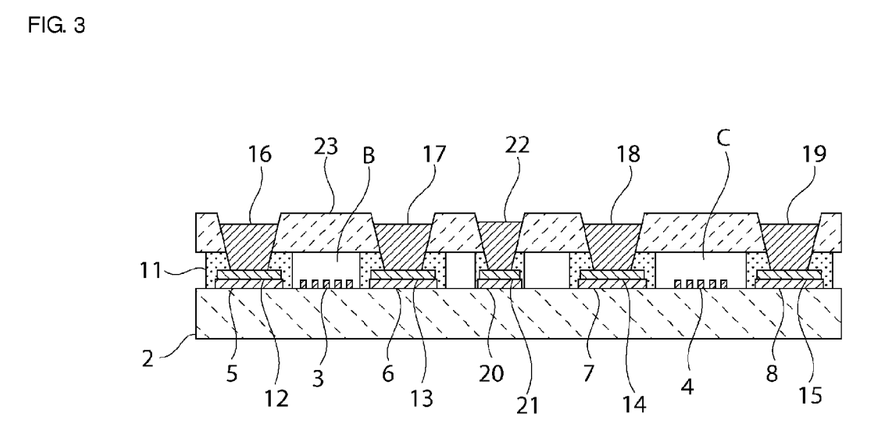
FIG. 3 is a schematic elevation cross-sectional view illustrating the manufacturing method of the elastic wave device according to the first preferred embodiment of the present invention.

Thereafter, the through-holes 23a are filled with a metal material to provide the under-bump metal layers 16 to 19 and the shield electrode 22, as illustrated in FIG. 3. The method for this process is not particularly limited, and the process may be performed by an appropriate method such as a method of forming a metal film over the entire surface and thereafter removing the metal film in the area other than the through-holes in accordance with the lift-off method.

Thereafter, the bumps 24 illustrated in FIG. 1A are formed. It is thereby possible to obtain the elastic wave device 1.

The above-described manufacturing method of the elastic wave device 1 is merely an example, and the method per se of manufacturing the elastic wave device 1 is not particularly limited. According to the above-described manufacturing method, however, the under-bump metal layers 16 to 19 are preferably made of the same metal material as that of the shield electrode 22, thus allowing the under-bump metal layers 16 to 19 and the shield electrode 22 to be formed in the same process. Accordingly, simplification of the manufacturing process and a reduction in costs are attained.

Further, as described above, in the present preferred embodiment, the metal film 21 is preferably made of a material superior in adhesion with the metal forming the under-bump metal layers 16 to 19 and the shield electrode 22, similarly to the metal films 12 to 15. It is therefore possible to enhance the adhesion of the shield electrode 22 with the metal film 21. Accordingly, it is possible to effectively improve the electromagnetic shielding effect over the entire area of the portion provided with the shield electrode 22.

Figure 6:
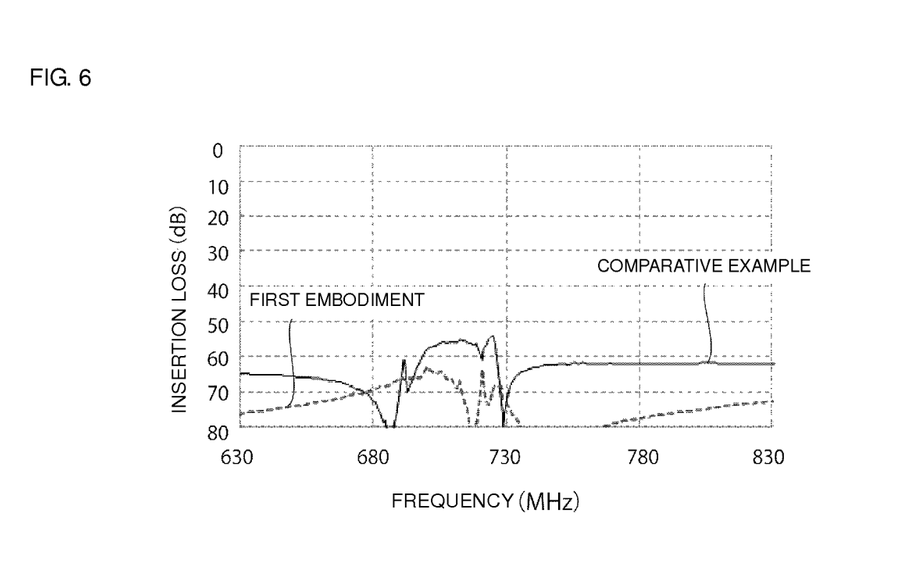
FIG. 6 illustrates the result of an experiment comparing the elastic wave device according to the first preferred embodiment of the present invention and an elastic wave device according to a comparative example in terms of common mode isolation characteristics.

FIG. 6 illustrates common mode isolation characteristics of the elastic wave device 1 according to the first preferred embodiment of the present invention and an elastic wave device according to a comparative example. The elastic wave device 1 according to the first preferred embodiment of the present invention preferably was configured as a balanced duplexer based on a communication standard Band 17 with a transmission frequency band ranging from 704 to 716 MHz and a reception frequency band ranging from 734 to 746 MHz, for example. The comparative example was configured similarly to the elastic wave device 1 according to the first preferred embodiment of the present invention, except that the through-holes and the shield electrode 22 are omitted. In FIG. 6, a broken line indicates the first preferred embodiment of the present invention, and a solid line indicates the comparative example.

It is understood from FIG. 6 that, according to the above-described example of the first preferred embodiment of the present invention, the attenuation in the transmission frequency band and the reception frequency band is greater than in the comparative example, and the common mode isolation characteristics are superior.

In the above-described preferred embodiments, the description has been given of the application to a duplexer of a cellular phone, for example. However, the present invention is not limited to the duplexer. That is, various preferred embodiments of the present invention are generally applicable to elastic wave devices in which a plurality of elastic wave element portions are provided on a piezoelectric substrate.

Accordingly, each of the first elastic wave element portion and the second elastic wave element portion is not limited to a band pass filter, a low pass filter, a high pass filter, and a band eliminate filter, and may be an element portion having various functions such as a resonator and an elastic wave delay line, for example.

Further, each of the first and second elastic wave element portions, which is a surface acoustic wave element portion in the above-described preferred embodiment, may be a boundary acoustic wave element portion or a bulk elastic wave element portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   a first electrode structure provided on the piezoelectric substrate, and defining a first elastic wave element portion;
   a second electrode structure provided on the piezoelectric substrate, and defining a second elastic wave element portion;
   a support frame provided on the piezoelectric substrate to surround a portion including the first elastic wave element portion and the second elastic wave element portion; and
   a cover layer provided on the support frame, and defining first and second hollow portions faced by the first and second elastic wave element portions; wherein
   the support frame includes a dividing wall portion that divides the first elastic wave element portion and the second elastic wave element portion, and a conductive shield electrode provided in a groove in the dividing wall portion.

2. The elastic wave device described in claim 1, wherein the groove is a through-groove vertically passing through the dividing wall portion of the support frame.

3. The elastic wave device described in claim 1, wherein the shield electrode extends over an entire length of the dividing wall portion.

4. The elastic wave device described in claim 1, wherein under-bump metal layers each electrically connected to the first electrode structure or the second electrode structure are provided in portions of the support frame to project upward from an upper surface of the support frame, and the under-bump metal layers and the shield electrode are made of a same material.

5. The elastic wave device described in claim 4, wherein the cover layer includes through-holes configured to accommodate the shield electrode and under-bump metal layers.

6. The elastic wave device described in claim 1, wherein at least one third elastic wave element portion is provided on the piezoelectric substrate.

7. The elastic wave device described in claim 1, wherein the first elastic wave element portion defines a reception filter section, and the second elastic wave element portion defines a transmission filter section to provide a duplexer.

8. The elastic wave device described in claim 1, wherein the shield electrode is connected to a ground potential.

9. The elastic wave device described in claim 1, wherein the dividing wall portion extends to connect a pair of mutually facing sides of the support frame, and to be parallel or substantially parallel to a remaining pair of sides of the support frame.

10. The elastic wave device described in claim 1, wherein the dividing wall portion extends to connect a pair of mutually facing sides of the support frame with a bent shape or a curved shape.

11. The elastic wave device described in claim 1, wherein the support frame is made of an insulating material.

12. The elastic wave device described in claim 1, further comprising at least one metal film provided on a portion of the support frame including the dividing wall portion.

13. The elastic wave device described in claim 12, wherein the groove faces the at least one metal film.

14. A manufacturing method of the elastic wave device described in claim 1, comprising:
    a step of preparing the piezoelectric substrate;
    a step of forming the first electrode structure and the second electrode structure on the piezoelectric substrate;
    a step of forming the support frame on the piezoelectric substrate to include the dividing wall portion;
    a step of providing the cover layer on the support frame to include the first and second hollow portions; and
    a step of providing the shield electrode in the dividing wall portion of the support frame.

15. The manufacturing method of the elastic wave device described in claim 14, wherein the step of forming the shield electrode comprises:
    a step of forming, in the dividing wall portion of the support frame, a concave groove opening in a portion of an upper surface of the dividing wall portion or a through-groove passing through the dividing wall portion; and
    a step of forming the shield electrode by filling the concave groove or the through-groove with the conductive material.

16. The manufacturing method of the elastic wave device described in claim 15, wherein the step of forming the concave groove or the though-groove in the dividing wall portion is performed by forming the cover layer on the support frame and thereafter forming the concave groove or the though-groove extending from the cover layer to the dividing wall portion.

17. The manufacturing method of the elastic wave device described in claim 16, further comprising:
    a step of, when forming the concave groove or the through-groove extending from the cover layer to the dividing wall portion, forming under-bump metal layer through-holes passing through the cover layer and extending to the support frame; and
    a step of, in the step of forming the shield electrode by filling the concave groove or the through-groove with the conductive material, forming under-bump metal layers by also filling the under-bump metal layer through-holes with a same conductive material.

18. The manufacturing method of the elastic wave device described in claim 17, further comprising a step of forming bumps on the under-bump metal layers to electrically connect with an external device.

19. The manufacturing method of the elastic wave device described in claim 14, wherein the first elastic wave element portion defines a reception filter section, and the second elastic wave element portion defines a transmission filter section, to provide a duplexer.

* * * * *